US009368319B2

(12) United States Patent
Tanii et al.

(10) Patent No.: US 9,368,319 B2
(45) Date of Patent: Jun. 14, 2016

(54) METHOD FOR REMOVING FOREIGN SUBSTANCES IN CHARGED PARTICLE BEAM DEVICE, AND CHARGED PARTICLE BEAM DEVICE

(71) Applicant: Hitachi High-Technologies Corporation, Minato-ku, Tokyo (JP)

(72) Inventors: Kazuma Tanii, Tokyo (JP); Yuji Kasai, Tokyo (JP); Masakazu Takahashi, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/433,886

(22) PCT Filed: Oct. 17, 2013

(86) PCT No.: PCT/JP2013/078186
§ 371 (c)(1),
(2) Date: Apr. 7, 2015

(87) PCT Pub. No.: WO2014/061738
PCT Pub. Date: Apr. 24, 2014

(65) Prior Publication Data
US 2015/0279609 A1    Oct. 1, 2015

(30) Foreign Application Priority Data
Oct. 18, 2012    (JP) .................................. 2012-230432

(51) Int. Cl.
*G01N 23/225*    (2006.01)
*G01N 21/956*    (2006.01)
(Continued)

(52) U.S. Cl.
CPC ............... *H01J 37/141* (2013.01); *H01J 37/21* (2013.01); *H01J 37/28* (2013.01); *H01J 2237/022* (2013.01); *H01J 2237/028* (2013.01); *H01J 2237/14* (2013.01); *H01J 2237/2817* (2013.01)

(58) Field of Classification Search
CPC ........ H01J 37/265; H01J 37/18; G01N 23/22; G01N 23/223; G01N 23/2251; G01N 23/225; G01N 21/6428; G01N 21/6458; G01N 21/648
USPC ........... 250/310, 306, 311, 309, 491.1, 492.3, 250/307, 397, 398
See application file for complete search history.

(56) References Cited

U.S. PATENT DOCUMENTS 7,462,839 B2* 12/2008 Gnauck ................. H01J 37/244
250/310
7,626,166 B2* 12/2009 Saito .................... G01N 23/225
250/306

(Continued)

FOREIGN PATENT DOCUMENTS

JP    63-76250 A    4/1988
JP    64-31339 A    2/1989

(Continued)

OTHER PUBLICATIONS

International Search Report (PCT/ISA/210) dated Dec. 10, 2013, with English translation (Five (5) pages).

*Primary Examiner* — David A Vanore
(74) *Attorney, Agent, or Firm* — Crowell & Moring LLP

(57) ABSTRACT

Foreign substances present in a sample chamber are attached to or drawn close to an objective lens and an electrode disposed close to the objective lens by applying a higher magnetic field than when normally used to the objective lens and applying a higher electric field than when normally used to the electrode disposed close to the objective lens. A stage is moved such that the center of an optical axis is located directly above a dedicated stand capable of applying voltage, the magnetic field of the objective lens is turned off, and then the potential difference between the electrode disposed close to the objective lens and an electrode disposed close to the sage is periodically maximized and minimized to thereby forcibly drop the foreign substances onto the dedicated stand capable of applying voltage.

11 Claims, 9 Drawing Sheets

UPON RETRIEVAL OF CONTAMINATIONS OR PARTICLES

(51) Int. Cl.
*H01J 37/16* (2006.01)
*H01J 37/244* (2006.01)
*H01J 37/141* (2006.01)
*H01J 37/28* (2006.01)
*H01J 37/21* (2006.01)

(56) References Cited

U.S. PATENT DOCUMENTS

| | | | |
|---|---|---|---|
| 8,153,966 B2 * | 4/2012 | Arai | H01J 3/027 250/251 |
| 8,497,476 B2 * | 7/2013 | Hatakeyama | G01N 23/2251 250/306 |
| 2008/0203301 A1 | 8/2008 | Saito et al. | |
| 2008/0274905 A1 * | 11/2008 | Greene | G01N 21/6428 506/4 |
| 2012/0235036 A1 * | 9/2012 | Hatakeyama | G01N 23/2251 250/310 |
| 2015/0279609 A1 * | 10/2015 | Tanii | H01J 37/28 250/398 |

FOREIGN PATENT DOCUMENTS

| | | |
|---|---|---|
| JP | 5-82062 A | 4/1993 |
| JP | 2006-332505 A | 12/2006 |
| JP | 2008-209312 A | 9/2008 |
| JP | 4945267 B2 | 6/2012 |
| JP | 2012-253007 A | 12/2012 |

* cited by examiner

BEFORE COLLECTION OF
CONTAMINATIONS OR PARTICLES

UPON COLLECTION OF
CONTAMINATIONS OR PARTICLES

UPON RETRIEVAL OF
CONTAMINATIONS OR PARTICLES

METHOD FOR REMOVING FOREIGN SUBSTANCES IN CHARGED PARTICLE BEAM DEVICE, AND CHARGED PARTICLE BEAM DEVICE

TECHNICAL FIELD

The present invention relates to a charged particle beam device for irradiating a sample with a charged particle beam and particularly to a method for removing contaminations or particles in a charged particle beam device capable of removing contaminations or particles present in a vacuum chamber and the charged particle beam device.

BACKGROUND ART

A charged particle beam device represented by a critical dimension scanning electron microscope (CD-SEM) for semiconductor wafer measurement is a device which forms an image based on signals (secondary electrons and/or reflected electrons) obtained by scanning a sample with a charged particle beam. As an object of inspection and measurement using the CD-SEM, there is a semiconductor device.

Miniaturization of the semiconductor device is advanced for improvement of device performance and circuit performance. Requirement for killer contaminations or particles permitted in the semiconductor device is getting also more severe by the miniaturization of the semiconductor device. As specific examples of contaminations or particles, there are contaminations due to outgas of the semiconductor device itself, minute contaminations or particles brought by the semiconductor device, dust from a sliding portion of the CD-SEM, and the like.

The contaminations or particles float in a vacuum sample chamber and attach to a stage, an objective lens, a wall of the sample chamber, and the like. If contaminations or particles attach to the semiconductor device being measured, there is a possibility that the yield is reduced, and accordingly management thereof is required. In current circumstances, contaminations or particles are measured periodically and, when they become out of specifications, a part of generation of contaminations or particles is cleaned with ethanol to remove contaminations or particles.

On the other hand, Patent Literature 1 discloses a method for removing contaminations or particles effectively while suppressing the contaminations or particles from attaching to a sample by turning off or reducing magnetization for an objective lens for focusing an electron beam or by turning off or lowering an applied voltage of a boosting plate for accelerating the electron beam while passing through the objective lens when the sample is removed from beneath the objective lens.

CITATION LIST

Patent Literature

Patent Literature 1: JP-B-4945267 (corresponding U.S. Pat. No. 7,626,166)

SUMMARY OF INVENTION

Technical Problem

The contaminations or particles can be removed by cleaning with ethanol; however, the sample chamber is required to be exposed to the atmosphere and there is a possibility that the contaminations or particles entering into the sample chamber when the sample chamber is exposed to the atmosphere reattach to the stage, the objective lens, the walls of the sample chamber, and the like and/or float in the sample chamber in a vacuum even if the sample chamber is evacuated after cleaning. Further, the down time of several hours is required for exposure to the atmosphere and evacuation, and it is not practical to conduct cleaning with ethanol frequently.

In the method for turning off or reducing magnetization for the objective lens or turning off or lowering the applied voltage to the boosting plate for accelerating the electron beam while passing through the objective lens as described in Patent Literature 1, forces of attaching the contaminations or particles to the objective lens or the boosting plate are weakened, so that the contaminations or particles fall down freely by the gravity. Accordingly, only when the gravity is greater than the forces of attaching the contaminations or particles, the contaminations or particles are made to fall down and there is a case where the contaminations or particles having large attaching forces cannot be removed sufficiently.

More specifically, even when the magnetization for the objective lens is turned off or reduced, influence of hysteresis remains and, even when the applied voltage to the boosting plate is turned off or reduced, influence of Coulomb force acting between the contaminations or particles and the boosting plate remains; accordingly, there is a case where the contaminations or particles remain to be attached. When such contaminations or particles are accumulated to form a large lump, it falls down by the gravity even when the objective lens is magnetized; it is difficult to grasp timings of the falls and it is desirable that the contaminations or particles are removed promptly before the contaminations or particles are accumulated.

The following description is made to a method for removing contaminations or particles in a charged particle beam device and the charged particle beam device with which even the contaminations or particles having large attaching forces are promptly removed while preventing them from falling down on a sample and the like or being scattered.

Solution to Problem

According to an aspect for achieving the above object, there is proposed a charged particle beam device including: an objective lens to focus a charged particle beam emitted from a charged particle source; a control unit to control strength of the objective lens; a vacuum chamber to maintain an atmosphere around a sample to be irradiated with the charged particle beam under vacuum; and a contamination or particle collector to retrieve contaminations or particles on a stage to which a sample is arranged or in a vacuum chamber; wherein the control unit moves the contamination or particle collector or the stage so that the contamination or particle collector is positioned below a beam passage opening of the objective lens, and applies a voltage to an electrode and/or a magnetic pole to generate potential difference between the contamination or particle collector or the stage and the objective lens so as to form the potential difference between the contamination or particle collector and the objective lens or between the stage and the objective lens while the contamination or particle collector is positioned below the beam passage opening of the objective lens.

Further, according to another aspect for achieving the above object, there is proposed a contamination or particle removing method in a charged particle beam device, for removing contaminations or particles in a vacuum chamber in the charged particle beam device, including the steps of: moving a stage in which a contamination or particle collector or a sample is disposed so that the contamination or particle collector, which retrieves the contaminations or particles, is positioned below a beam passage opening of an objective lens which focuses a charged particle beam; and forming potential difference between the contamination or particle collector or the stage and the objective lens while the contamination or particle collector is positioned below the beam passage opening of the objective lens.

Advantageous Effects of Invention

According to the above configuration, since the contaminations or particles can be removed from the objective lens and the like while the contamination or particle collector is positioned below the beam passage opening of the objective lens, the contaminations or particles can be retrieved while suppressing the possibility that the contaminations or particles are attached to the sample and/or the contaminations or particles spread in the vacuum chamber.

Other objects, features, and advantages of the invention will become apparent from the following description of the embodiment of the invention taken in conjunction with the accompanying drawings.

DESCRIPTION OF EMBODIMENTS

A scanning electron microscope provided with a contamination or particle collector is now described hereinafter. In the present embodiment, particularly, an example for controlling a magnetizing current and/or an applied voltage to let an objective lens generate a stronger magnetic field than normally used, to let an electrode disposed around the objective lens generate a greater electric field than normally used, or to let the magnetic field and the electric field become greater than normally used prior to retrieval of the contaminations or particles is described. The stronger magnetic field and electric field than being used for the scanning electron microscope are formed to thereby be able to make the contaminations or particles present in a sample chamber be attached to an objective lens and an electrode disposed around the objective lens or be attracted to the vicinity thereof. The attached or attracted contaminations or particles can be forced to fall down on the contamination or particle collector disposed near a sample stage by forming potential difference between the objective lens or the electrode disposed around the objective lens and an electrode disposed around the stage, so that the contaminations or particles can be removed while suppressing the possibility that the contaminations or particles are attached to a sample or scattered. Further, at this time, the potential difference can be minimized and maximized periodically to thereby promote removal of the contaminations or particles attached to the objective lens and the like and enhance the retrieval efficiency.

Incidentally, in the embodiment, as described above, the example in which the contaminations or particles once attracted to the vicinity of the objective lens are retrieved by the electric field and/or the magnetic field is mainly described; however, when attachment of the contaminations or particles is remarkable, only retrieval using the electric field may be performed.

With the above configuration, the contaminations or particles in the sample chamber can be actively gathered without exposing the sample chamber to the atmosphere and the gathered contaminations or particles can be collected with high efficiency.

Figure 1:
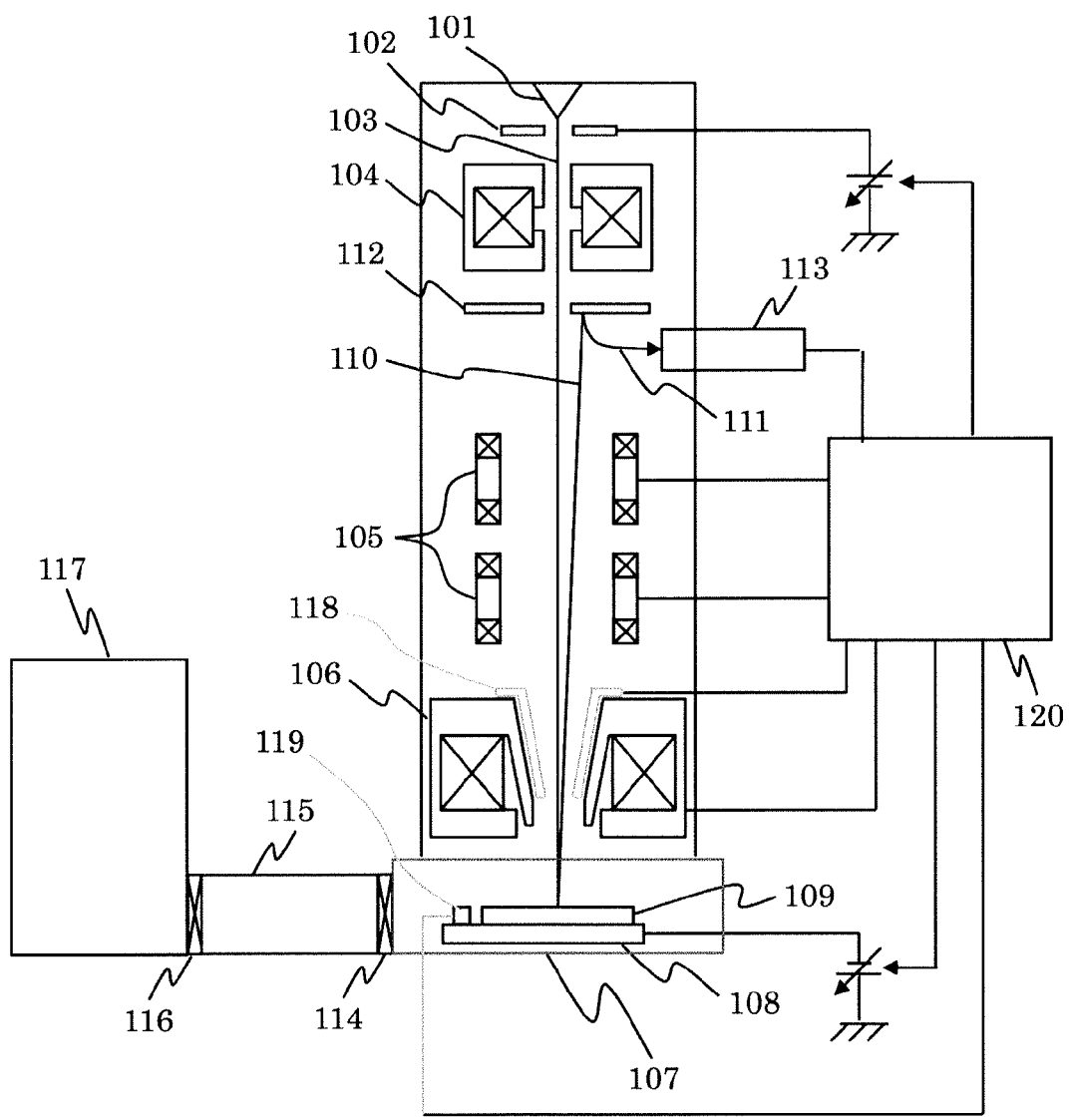
FIG. 1 It shows a schematic of a scanning electron microscope.

FIG. 1 is a schematic diagram illustrating a scanning electron microscope according to the present invention. An electron beam 103 extracted out from an electron source 101 by an extraction electrode 102 and accelerated by an acceleration electrode not shown is squeezed by a condenser lens 104 that is a mode of a converging lens, and then is scanned on a sample 109 one-dimensionally or two-dimensionally by a scanning deflector 105. The electron beam 103 is decelerated by a negative voltage applied to an electrode included in a sample stage 108 and is focused by lens action of an objective lens 106 to impinge on the sample 109.

When the sample 109 is irradiated with the electron beam 103, electrons 110 such as secondary electrons and backscattered electrons are emitted from an irradiation spot. The emitted electrons 110 are accelerated in the direction toward the electron source by the acceleration action based on negative voltage applied to the sample and collide with a conversion electrode 112 to generate secondary electrons 111. The secondary electrons 111 emitted from the conversion electrode 112 are caught by a detector 113 and output of the detector 113 varies in accordance with an amount of the caught secondary electrons. Brightness of a display unit not shown is changed in accordance with the output. For example, when a two-dimensional image is formed, a deflection signal to the scanning deflector 105 and the output of the detector 113 are synchronized with each other to thereby form an image of a scanned area.

Moreover, the scanning deflector 105 may be supplied with a deflection signal for moving the field of view in superposition on a deflection signal for making two-dimensional scanning in the field of view. Deflection by this deflection signal is also called an image shift deflection and the position of the field of view of the electron microscope can be moved without moving the sample using the sample stage or the like. In the present embodiment, an example in which the image shift deflection and the scanning deflection are performed by a common deflector is described; however, the deflector for image shift and the deflector for scanning may be provided separately.

Incidentally, in the example of FIG. 1, there has been described the example in which the electrons emitted from the sample are once converted at the conversion electrode to be detected; however, it is a matter of course that the present invention is not limited to such a configuration and it is possible to adopt a configuration in which an electron multiplier tube or a detection plane of a detector is arranged on trajectories of accelerated electrons, for example.

A control unit 120 controls each component of the scanning electron microscope and has the functions of forming an image based on the detected electrons and measuring a width of pattern formed on the sample based on the intensity distribution of the detected electrons called a line profile.

Furthermore, in the scanning electron microscope exemplified in FIG. 1, a preliminary exhaust chamber 115 for preliminarily evacuating an atmosphere of the sample at the time that the sample is introduced into a sample chamber 107 and a mini environment 117 for forming clean atmosphere environment are installed. Moreover, vacuum valves 114 and 116 for attaining vacuum sealing are disposed therebetween.

Figure 3:
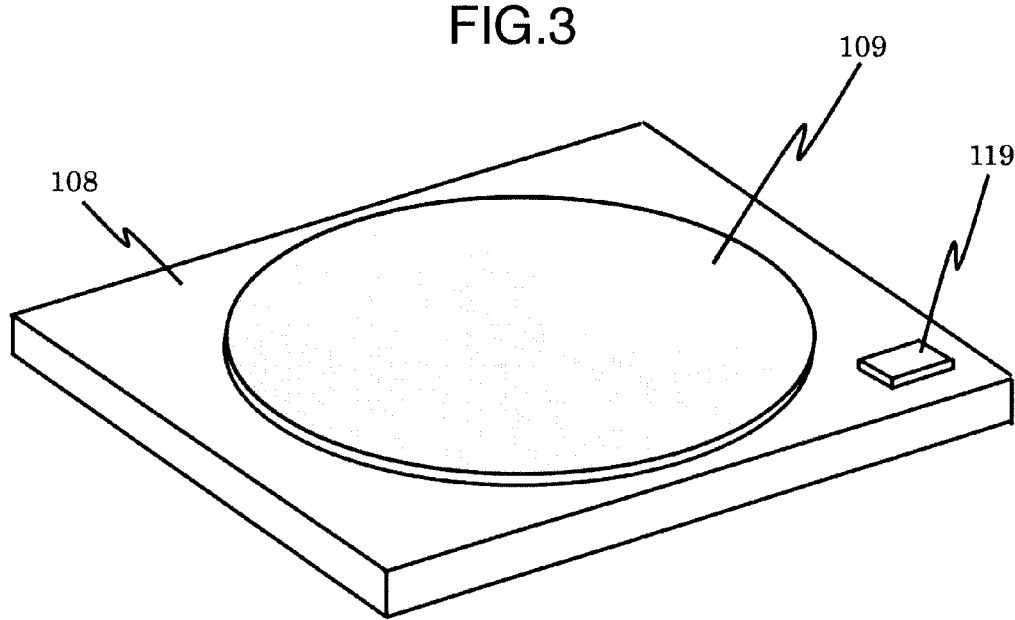
FIG. 3 It shows a sample stage provided with a contamination or particle collector.

A positive or negative voltage is applied to an electric-field forming electrode 118 in response to an instruction from the control unit 120, so that a surface electric field on the sample 109 is controlled. Normally, the electric-field forming electrode 118 is used to form an electric field for pulling up electrons emitted from the sample 109 toward the electron source 101 and/or to form an electric field for retarding back electrons having low energies. Further, a contamination or particle collector 119 is disposed on the sample stage 108. As exemplified in FIG. 3, the contamination or particle collector 119 is disposed outside of a mounting position of the sample 109 on the sample stage 108.

The method of retrieving the contaminations or particles within the scanning electron microscope as configured above is now described. Incidentally, the following embodiment is described by taking the scanning electron microscope as an example; however, it is not limited thereto and, for example, it is applicable to retrieval of contaminations or particles of other charged particle beam devices such as a focused ion beam in which an ion beam is used as a probe.

Figure 2:
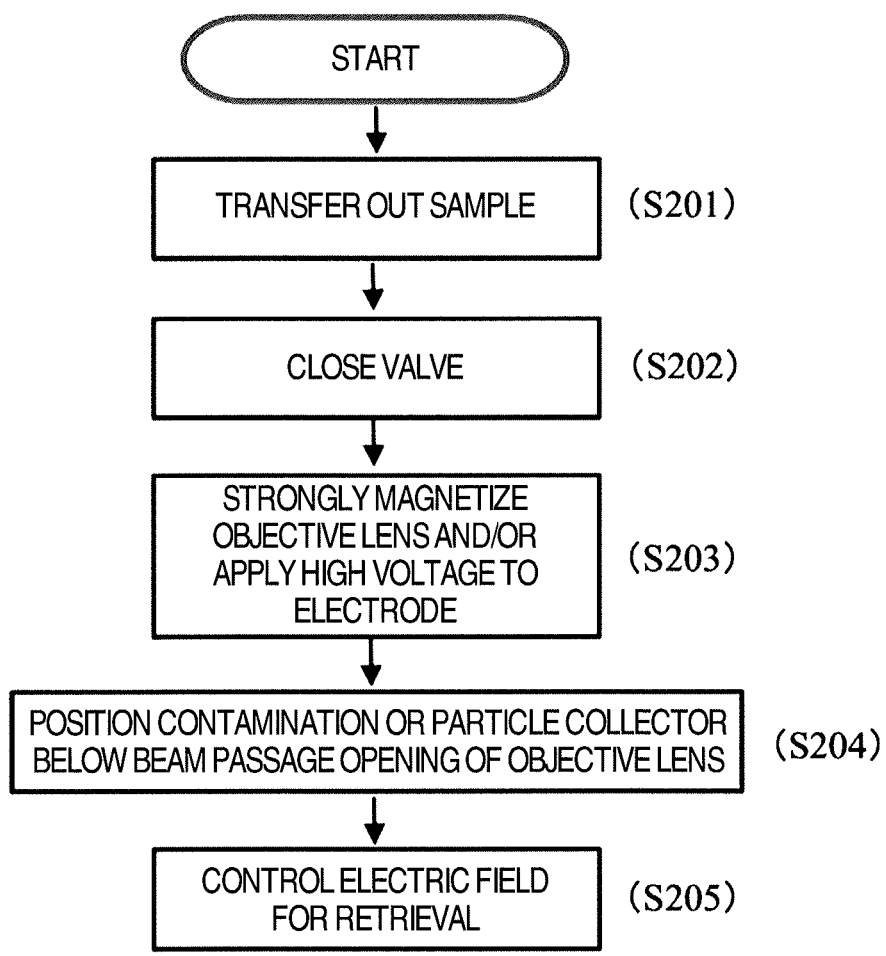
FIG. 2 It is a flow chart showing collection and retrieval process of contaminations or particles.

FIG. 2 is a flow chart showing collection and retrieval process of contaminations or particles. First, the sample 109 is transferred out from the sample chamber 107 and the vacuum valve 114 is closed (Steps S201 and S202). Next, contaminations or particles present in the sample chamber are attached to the objective lens and the electrode disposed around the objective lens or attracted to the vicinity thereof by forming a stronger magnetic field than normally used to the objective lens and/or applying a stronger electric field than normally used to the electrode disposed around the objective lens (Step S203). The electric field for collecting the contaminations or particles is formed by applying, for example, to the electric-field forming electrode 118 a higher voltage as compared with the case of being used as an electron microscope. When the device is used as an electron microscope, the magnetizing current and the like of the objective lens are controlled in order to narrow the beam; however, in the case of this example, since the magnetic field and the like are generated in order to collect the contaminations or particles, priority is given to the collection efficiency irrespective of the focusing conditions and the like and a stronger electric field or magnetic field is formed as compared with the case where the device is used as an electron microscope. Namely, the collection efficiency of the contaminations or particles can be enhanced by application of a greater voltage and/or supply of a larger current as compared with the case where irradiation is made with the beam.

Figure 5A:
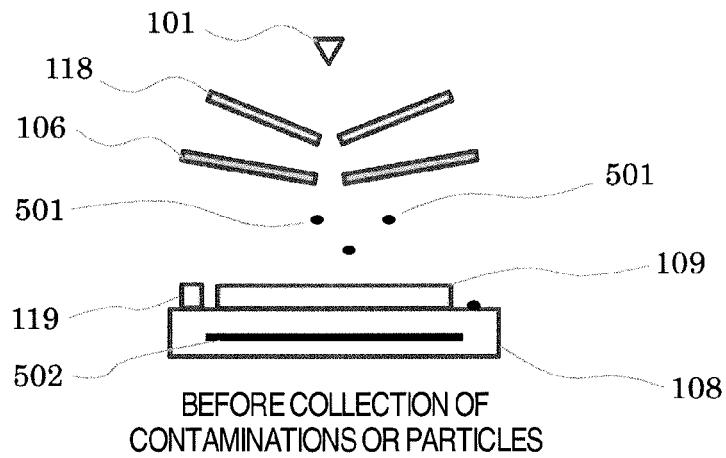
FIG. 5A It shows movement of contaminations or particles in a contamination/particle collection process and a contamination/particle retrieval process.
Figure 5B:
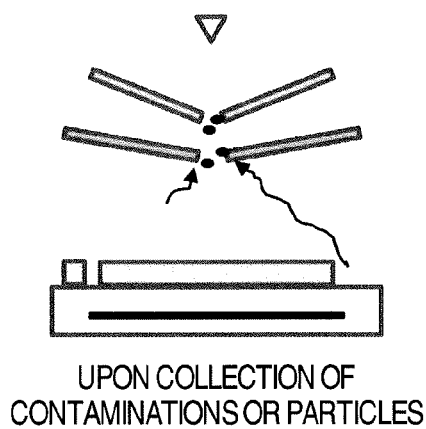
FIG. 5B It shows movement of the contaminations or particles in the contamination/particle collection process and the contamination/particle retrieval process.

FIGS. 5A and 5B are diagrams showing positions of contaminations or particles 501 before and after collection of the contaminations or particles by forming a strong electric field and the like. As shown in the figures, the contaminations or particles 501 are gathered on the objective lens 106 and/or the electric-field forming electrode 118 by strong magnetization of the objective lens 106 or high voltage application to the electric-field forming electrode 118. Since the contaminations or particles of metal are attracted to the objective lens and the contaminations or particles of insulator and nonconductor charged with electricity are attracted to the electrode disposed around the objective lens, it is desirable that the strong magnetization of the objective lens and the high voltage application to the electric-field forming electrode are performed together in order to remove the contaminations or particles without omission.

Figure 5C:
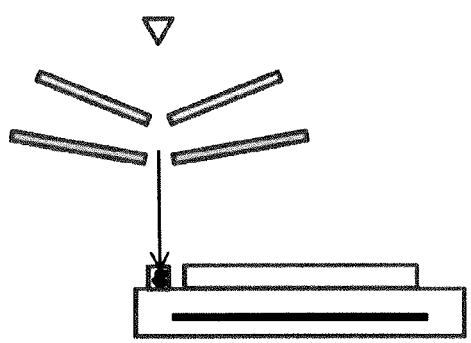
FIG. 5C It shows movement of the contaminations or particles in the contamination/particle collection process and the contamination/particle retrieval process.

After the contaminations or particles are attached or attracted to the vicinity, the stage is moved so that the center of the optical axis is positioned right above a dedicated stand to which voltage can be applied (Step S204). In this case, the sample stage 108 is moved so that the contamination or particle collector 119 is positioned right below a passage opening of the objective lens which the electron beam passes through and in which the contaminations or particles are concentrated most. Next, while the contamination or particle collector 119 is positioned below the beam passage opening of the objective lens 106, the magnetic field of the objective lens 106 is turned off or weakened relatively and an electric field is formed by application of voltage to the electrode disposed around the objective lens, so that the contaminations or particles are forced to fall down on the contamination or particle collector 119. FIG. 5C is a diagram showing the state that the contaminations or particles are made to fall down on the contamination or particle collector 119 by control of the electric field.

In the case of the present embodiment, after the magnetic field of the objective lens is turned off, the potential difference between the electrode disposed around the objective lens and the electrode disposed around the stage is maximized and minimized periodically to thereby force the contaminations or particles to fall down on the dedicated stand to which voltage can be applied. The reason that the magnetic field of the objective lens is turned off is that the force of attaching the contaminations or particles to the objective lens is weakened and at the same time the contaminations or particles forced to fall down are suppressed from being reattached to the objective lens.

When the potential difference is generated between the electrode disposed around the objective lens and the electrode disposed around the stage, the potential difference can be generated by both of the voltages or either one of the voltages. For example, when the voltage at the electrode disposed around the objective lens is 5 kV and the voltage at the electrode disposed around the stage is 0 kV, the potential difference is 5 kV. When the voltage at the electrode disposed around the objective lens is 5 kV and the voltage at the electrode disposed around the stage is −5 kV, the potential difference is 10 kV. When the voltage at the electrode disposed around the objective lens is 0 kV and the voltage at the electrode disposed around the stage is −5 kV, the potential difference is 5 kV. That is, the potential difference can be generated by various methods. However, in order to generate high potential difference only by either one, it is necessary to provide a large-scale power supply. Accordingly, it is desirable that higher potential difference is generated by two voltages.

Figure 13:
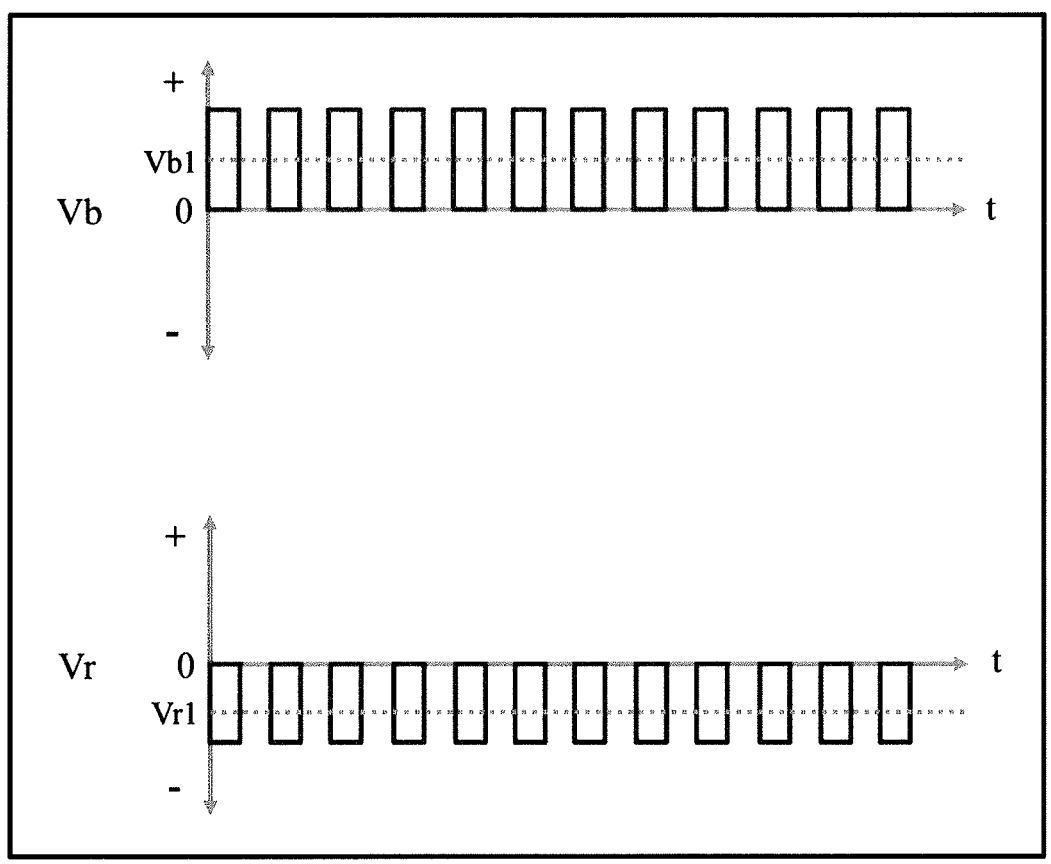
FIG. 13 It is a timing chart showing change of voltages applied to electrodes around a sample with respect to time.

FIG. 13 is a timing chart showing change of voltages applied to the respective electrodes at the time of retrieval of contaminations or particles with respect to time. Vb is an applied voltage to the electric-field forming electrode 118 and Vr is an applied voltage to a retarding electrode embedded in the sample stage. As exemplified in FIG. 13, the applied voltages Vb and Vr are changed in synchronism with each other and controlled so that the potential difference between both the electrodes repeats between the maximum (|Vb|+|Vr|) and the minimum (0V), so that falling down of the contaminations or particles can be further promoted. Incidentally, Vb1 and Vr1 in FIG. 13 are maximum values of the applied voltages at the time that measurement and observation with the electron microscope are made. In this manner, higher voltages exceeding voltage ranges used when it is employed as the electron microscope can be applied to enable enhancement of the certainty that the contaminations or particles are made to fall down.

Figure 6:
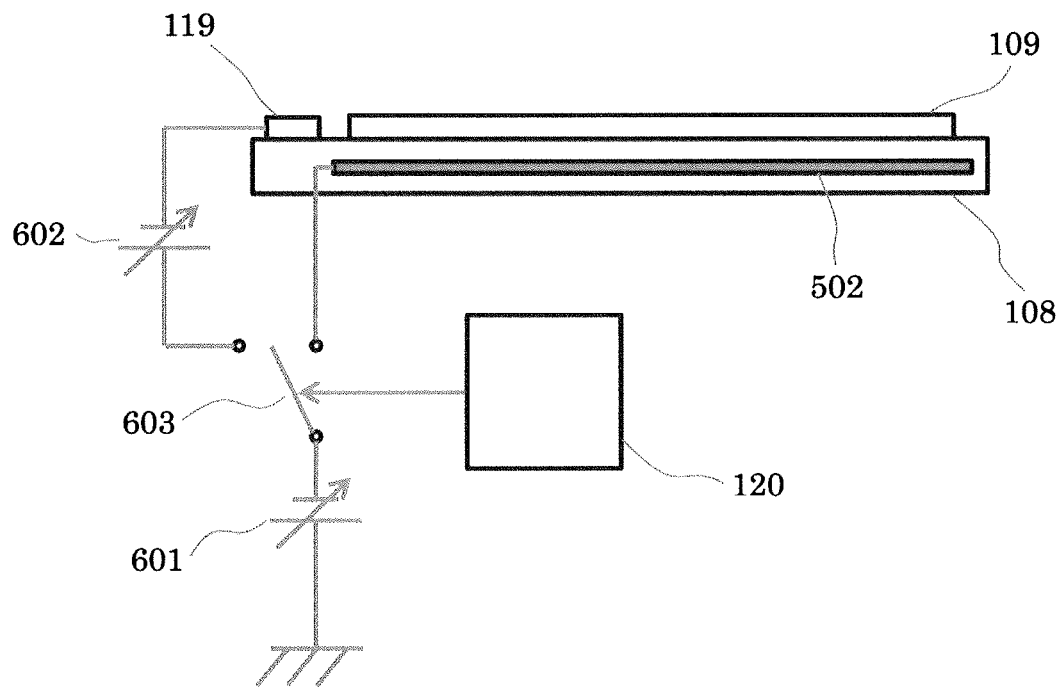
FIG. 6 It shows a circuit configuration containing a power supply for generating potential difference between the contamination or particle collector and an objective lens.

FIG. 6 is a diagram illustrating an example of the sample stage including a retarding electrode 502 to which a retarding voltage is applied. The retarding electrode 502 is a mode of the electrode disposed around the stage. Further, in the example of FIG. 6, an auxiliary power supply 602 for generation of strong electric field is provided in addition to a usual retarding voltage power supply 601. As described above, the contaminations or particles can be forced to fall down even by controlling the applied voltage to the retarding electrode 502; however, since the potential toward the center of the sample stage 108 becomes higher as viewed from the contamination or particle collector 119, there is a possibility that the gradient of the potential is formed around the contamination or particle collector 119 and the falling contaminations or particles are deflected. According to the example of FIG. 6, at the time of retrieval of the contaminations or particles, by changing over a switch 603 with the control unit 120 and rendering the contamination or particle collector 119 to be at a higher potential, the above-mentioned potential gradient can be removed.

Figure 7:
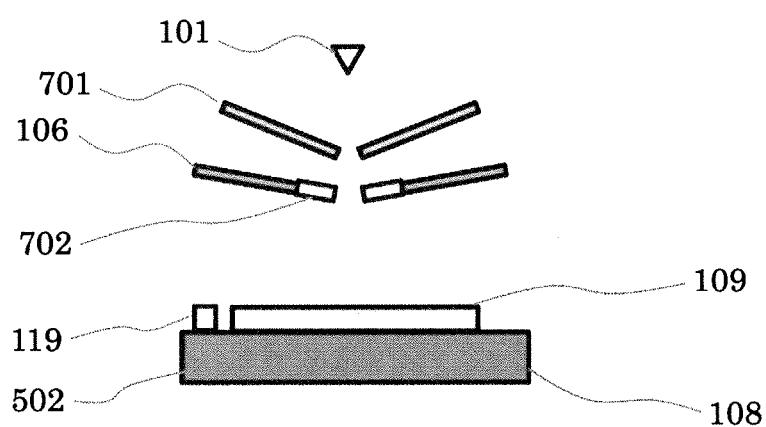
FIG. 7 It shows a schematic of a scanning electron microscope provided with an electrode for controlling an electric field on a sample.
Figure 8:
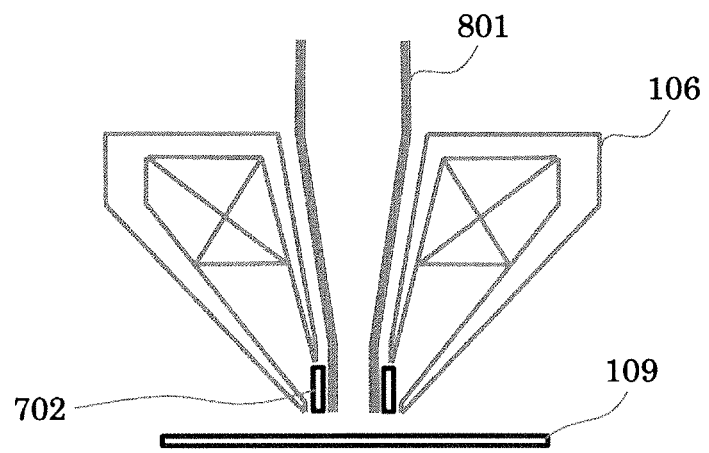
FIG. 8 It shows an example of a boosting plate for accelerating a beam and an objective lens.
Figure 9:
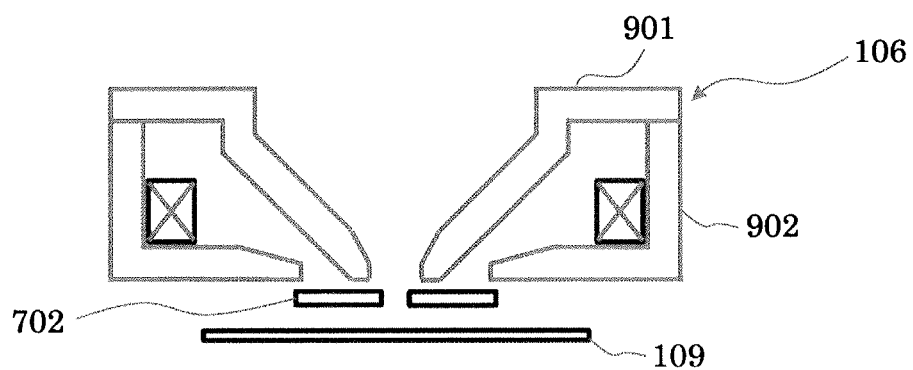
FIG. 9 It shows an example of an objective lens in which part of a magnetic pole piece is rendered to be an accelerator for accelerating a beam.

The electrode disposed around the objective lens is not limited to an electrode disposed toward the electron source compared with the principal surface of the objective lens and facing the sample like the electric-field forming electrode 118, but it may be substituted with an electrode positioned on the principal surface of the objective lens or below it. FIG. 7 is a diagram showing an example in which an electric-field forming electrode 702 is provided below the magnetic pole of the objective lens 106. FIGS. 8 and 9 are diagrams for explaining an installation example of the electric-field forming electrode 702 in more detail. FIG. 8 is a diagram showing an example in which a boosting plate 801 for accelerating the electron beam is disposed in the beam passage opening of the objective lens 106. The electric field can be controlled at the time of retrieval of the contaminations or particles by a voltage applied to the electric-field forming electrode 702 and/or the boosting plate 801. Further, where FIG. 9 is a diagram illustrating a construction of the objective lens 106 which is divided into an upper magnetic pole 901 and a lower magnetic pole 902 to accelerate the electron beam by applying a high voltage to the upper magnetic pole 901 selectively, the electric field may be controlled at the time of retrieval of the contaminations or particles by a voltage applied to the upper magnetic pole 901 and/or the electric-field forming electrode 702. In addition, the electrode or the like for controlling the trajectories of secondary electrons may be used as an electric field control electrode at the time of retrieval of the contaminations or particles.

Figure 10:
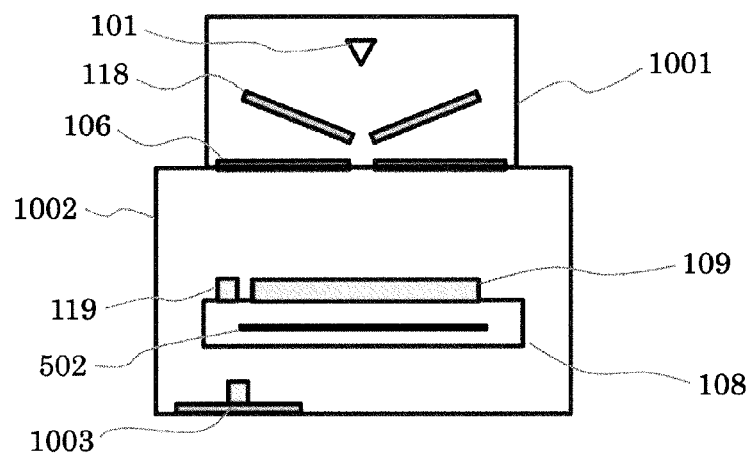
FIG. 10 It shows a schematic of a scanning electron microscope including a contamination or particle collector at the bottom of a sample chamber.

The electrode disposed around the stage can be substituted with a different electrode other than the retarding electrode 502 or the contamination or particle collector 119. A specific example is shown in FIG. 10. FIG. 10 illustrates an example in which an electric-field forming electrode 1003 is disposed at the bottom of a vacuum sample chamber 1002 of an electron microscope including an electron beam column 1001 and the vacuum sample chamber 1002. However, when the electrode disposed at the bottom of the sample chamber is utilized, a distance between the electrode disposed around the objective lens and it becomes long and, accordingly, a higher voltage is required to force the contaminations or particles to fall down. As described above, the contaminations or particles can be retrieved even with the retarding electrode and the electrode disposed at the bottom of the sample chamber; however, it is necessary to dispose a voltage-applicable dedicated stand on the upper surface of the electrode used.

The contaminations or particles can be attached to the objective lens or attracted to the vicinity thereof by generating a stronger magnetic field than being used normally in the objective lens. At this time, the stronger the magnetic field is, the higher the efficiency of attachment or attraction of the contaminations or particles is; accordingly, it is desirable to be able to apply a stronger magnetic field to the objective lens.

The contaminations or particles can be attached to the electrode disposed around the objective lens or attracted to the vicinity thereof by generating a stronger electric field than being used normally in the electrode disposed around the objective lens. At this time, the stronger the electric field is, the higher the efficiency of attachment or attraction of the contaminations or particles is; accordingly, it is desirable to be able to apply a stronger electric field to the electrode disposed around the objective lens.

When the contaminations or particles are attached or attracted, no voltage is applied to the electrode disposed around the stage. It is because, even when the contaminations or particles are attached to the electrode disposed around the stage or attracted to the vicinity thereof, they cannot be forced to fall down on the voltage-applicable dedicated stand.

When the contaminations or particles are forced to fall down on the voltage-applicable dedicated stand, the higher the potential difference is, the higher the efficiency for forcing down is; accordingly, it is desirable to be able to generate the larger potential difference between the electrode disposed around the objective lens and the electrode disposed around the stage.

When the contaminations or particles are forced to fall down, there is a possibility that the contaminations or particles forced to fall down collide against the upper surface of the voltage-applicable dedicated stand and bounce back to thereby float in the sample chamber again; accordingly, the upper surface of the voltage-applicable dedicated stand is preferably formed in a mesh structure so that the collection efficiency is improved. Furthermore, in order to generate the larger potential difference, it is desirable to set the height so that it is positioned nearer to the electrode around the objective lens. At this time, it is necessary to design it so as not to come into contact with and/or interfere with the lens system.

When the contaminations or particles are forced to fall down, it is desirable that vacuum grease is thinly applied in the voltage-applicable dedicated stand or an electric field and a magnetic field are generated in the voltage-applicable dedicated stand for absorption of the contaminations or particles so that the contaminations or particles collected on the voltage-applicable dedicated stand do not float back in the sample chamber again. At this time, it is necessary to design it so that interference with primary and secondary electrons does not occur.

Figure 4:
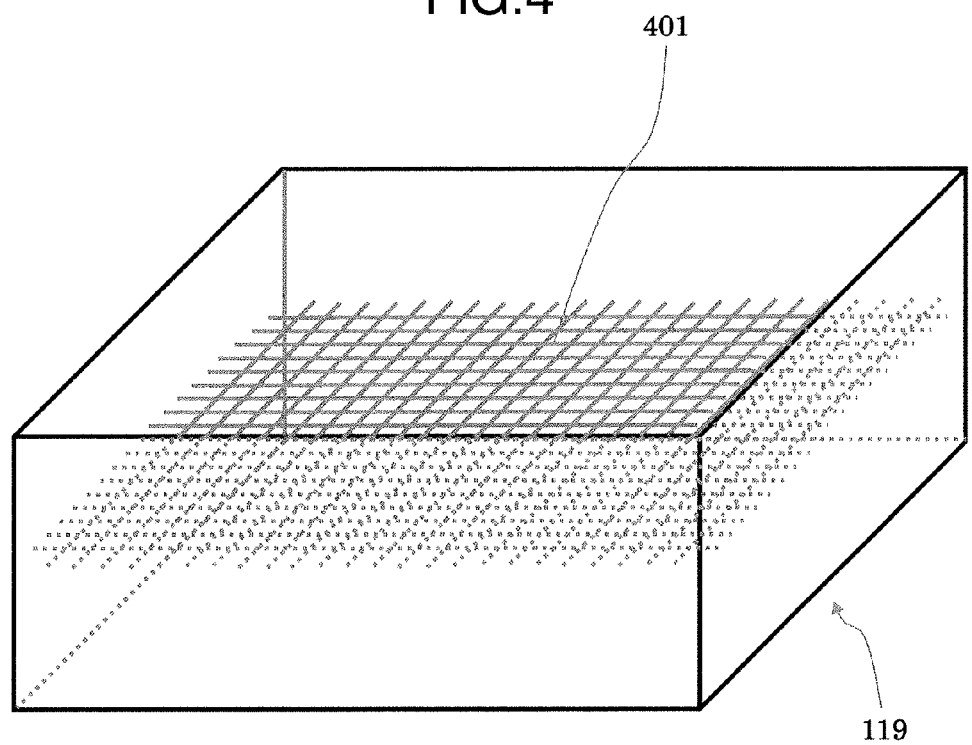
FIG. 4 It shows a schematic of the contamination or particle collector.

FIG. 4 is a diagram illustrating an example of the contamination or particle collector 119. The contamination or particle collector 119 is formed into a container and can contain or be applied with a small amount of vacuum grease. Further, a mesh electrode 401 is provided inside and a voltage for controlling the electric field at the time of retrieval of the contaminations or particles can be applied.

Figure 11:
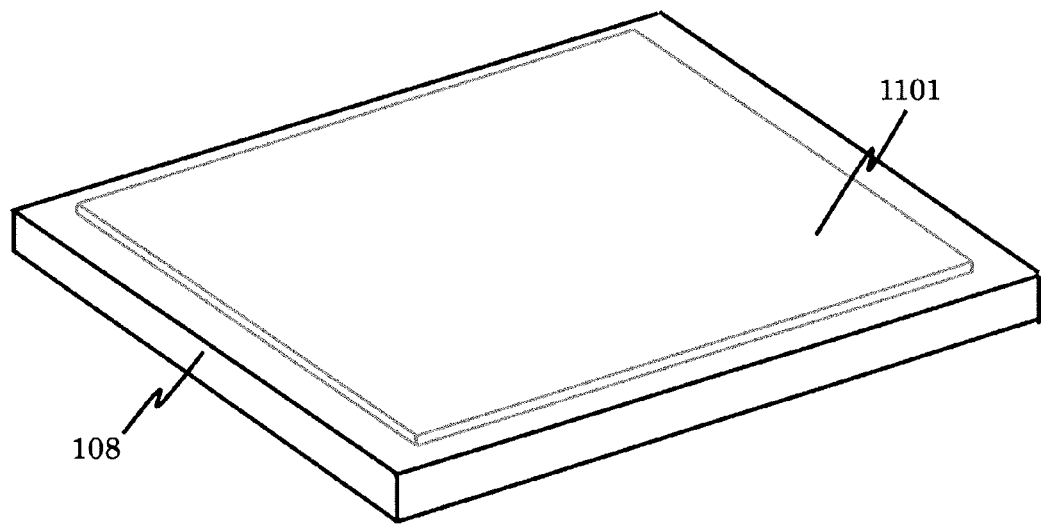
FIG. 11 It shows an example in which a contamination or particle collector is mounted on a sample stage.

The retrieval of the contaminations or particles can be performed using a bare wafer on the stage or the contamination or particle collector which can be introduced from the outside of the sample chamber instead of collecting on the voltage-applicable dedicated stand. FIG. 11 is a diagram illustrating an example in which a contamination or particle collector 1101 transferred in from the outside of the sample chamber is mounted on the sample stage 108. The contamination or particle collector having a large surface area can be applied to improve the contamination or particle retrieval efficiency.

Figure 12:
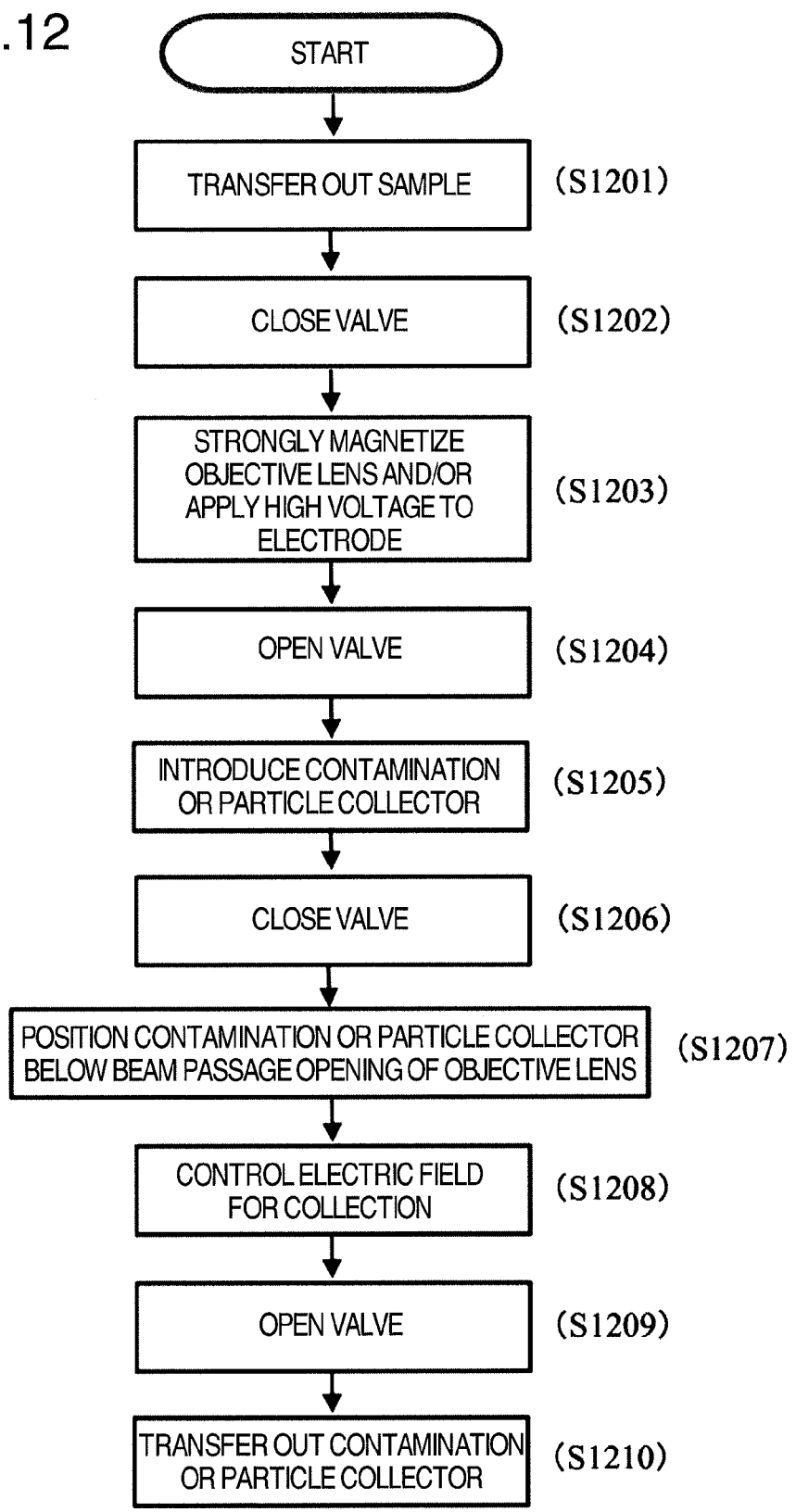
FIG. 12 It is a flow chart showing the process for retrieving contaminations or particles by introducing a contamination or particle collector into a sample chamber.

FIG. 12 is a flow chart showing the contamination or particle retrieval process using the contamination or particle collector 1101. First, a sample is transferred out and, then, the vacuum valve 114 is closed (Steps S1201 and S1202). Next, the electric field and/or the magnetic field is controlled to collect the contaminations or particles on the objective lens (Step S1203) and the vacuum valve 114 is opened to introduce the contamination or particle collector 1101 while maintaining the state (Steps S1204 and S1205). Thereafter, the vacuum valve 114 is closed and the sample stage 108 is moved so that the contamination or particle collector 1101 is positioned below the beam passage opening of the objective lens (Steps S1206 and S1207). Next, while the contamination or particle collector 1101 is positioned below the beam passage opening of the objective lens 106, the magnetic field of the objective lens 106 is turned off or is relatively weakened and the electric field is formed by application of voltage to the electrode disposed around the objective lens, so that the contaminations or particles are forced to fall down on the contamination or particle collector 1101 (Step S1208). Thereafter, the vacuum valve 114 is opened and the contamination or particle collector 1101 is transferred out (Steps S1209 and S1210).

By retrieving the contaminations or particles via the process as shown in FIG. 12, the contaminations or particles can be removed with high efficiency without leaving the contamination or particle collector in the sample chamber.

Further, according to the example of FIG. 11, while the contamination or particle collector 1101 is mounted on the sample stage 108, the electric field for retrieval of the contaminations or particles is controlled and the sample stage 108 is moved to scan the movable range of the contamination or particle collector 1101, so that the contaminations or particles can be removed over the wide range in the sample chamber. However, the operation that a bare wafer and the like are transferred each time the contaminations or particles are forced to fall down may become a cause for reducing the throughput of the device and, accordingly, it is desirable that the contamination or particle removing member is provided in the sample chamber in advance.

Moreover, the contaminations or particles can be merely forced to fall down to the bottom of the sample chamber or the like without using the contamination or particle collector and the like; however, there is a possibility that the contaminations or particles float back in the sample chamber again when they are merely forced to fall down and, therefore, it is desirable to collect on the voltage-applicable dedicated stand.

In the actual operation of collection, it is indispensable not to influence the throughput. Specifically, a large number of product lots are processed in the semiconductor manufacturing line and, accordingly, collection must be performed without impeding the processing.

A specific example is described. In the semiconductor manufacturing line in which a CD-SEM is installed, the product lots are automatically transferred and the CD-SEM can grasp the product lots being waited for processing. Therefore, only when there is no product lot being waited for processing, collection is performed once after processing of the product lots. Further, there is a case where there are not many lots to be processed depending on the semiconductor manufacturing line. In such a case, since the possibility that clean atmosphere can be maintained in the sample chamber is high and it is not necessary to perform collection in each of lots to be processed, it is desirable that a fixed threshold can be set at the timing for collection. For example, when one week elapsed or the number of product lots processed exceeds 500 sheets since the last collection and there is no product lot being waited for processing, collection is performed once after processing of product lots. Moreover, starting or re-starting of the device can be used as a trigger for collection.

On the other hand, there is a possibility that the product lots having increased outgas for the cause of process or material that is not subjected to cleaning for removal of contaminations or particles are processed in the relationship with the semiconductor manufacturing process. In such case, it is desirable that the collection is performed at regular intervals of measurement or at the time when the degree of vacuum is observed to deteriorate.

The above description has been made to the embodiment; however, it is apparent for a person having ordinary skill in the art that the present invention is not limited thereto and various alterations and modifications can be made within the spirit of the present invention and the scope of the annexed claims.

REFERENCE SIGNS LIST

101 . . . electron source
102 . . . extraction electrode
103 . . . electron beam
104 . . . condenser lens
105 . . . scanning deflector
106 . . . objective lens
107 . . . sample chamber
108 . . . sample stage
109 . . . sample
120 . . . control unit

The invention claimed is:
1. A charged particle beam device comprising:
an objective lens to focus a charged particle beam emitted from a charged particle source;
a control unit to control strength of the objective lens;

a vacuum chamber to maintain an atmosphere around a sample to be irradiated with the charged particle beam under vacuum; and a contamination or particle collector to retrieve contaminations or particles on a stage to which a sample is arranged or in a vacuum chamber;

wherein the control unit moves the contamination or particle collector or the stage so that the contamination or particle collector is positioned below a beam passage opening of the objective lens, and applies a voltage to an electrode and/or a magnetic pole to generate potential difference between the contamination or particle collector or the stage and the objective lens so as to form potential difference between the contamination or particle collector and the objective lens or between the stage and the objective lens while the contamination or particle collector is positioned below the beam passage opening of the objective lens.

2. The charged particle beam device according to claim 1, wherein the control unit periodically changes potential difference between the contamination or particle collector and the objective lens or between the stage and the objective lens while the contamination or particle collector is positioned below the beam passage opening of the objective lens.

3. The charged particle beam device according to claim 1, wherein the control unit generates the potential difference by controlling at least one of an applied voltage to the contamination or particle collector, an applied voltage to the stage, an applied voltage to a facing electrode facing to the sample, and an applied voltage to a boosting plate which accelerates the charged particle beam.

4. The charged particle beam device according to claim 1, wherein the control unit performs magnetization of the objective lens and/or application of a voltage to an electrode for generating potential difference between the stage and an objective lens, before the potential difference is formed.

5. The charged particle beam device according to claim 4, wherein the control unit performs magnetization of the objective lens by supplying the objective lens with a larger current as compared with a case where the sample is irradiated with the beam, before the potential difference is formed.

6. The charged particle beam device according to claim 4, wherein the control unit applies larger voltage as compared with a case where the sample is irradiated with the beam to an electrode and/or a magnetic pole to generate potential difference between the stage and an objective lens, before the potential difference is formed.

7. The charged particle beam device according to claim 1, wherein the contamination or particle collector is disposed in the stage or the vacuum chamber.

8. The charged particle beam device according to claim 7, wherein vacuum grease is applied to the contamination or particle collector.

9. The charged particle beam device according to claim 7, wherein a mesh-like electrode is provided in the contamination or particle collector.

10. A contamination or particle removing method in a charged particle beam device, for removing contaminations or particles in a vacuum chamber in the charged particle beam device, comprising the steps of:

moving a stage in which a contamination or particle collector or a sample is disposed so that the contamination or particle collector, which retrieves the contaminations or particles, is positioned below a beam passage opening of an objective lens which focuses a charged particle beam; and forming potential difference between the contamination or particle collector or the stage and the objective lens while the contamination or particle collector is positioned below the beam passage opening of the objective lens.

11. A charged particle beam device comprising:

an objective lens to focus a charged particle beam emitted from a charged particle source;

a control unit to control strength of the objective lens;

a vacuum chamber to maintain an atmosphere around a sample to be irradiated with the charged particle beam under vacuum; and a contamination or particle collector to retrieve contaminations or particles on a stage to which a sample is arranged or in a vacuum chamber;

wherein the control unit moves the contamination or particle collector or the stage so that the contamination or particle collector is positioned below a beam passage opening of the objective lens, and applies a voltage to an electrode and/or a magnetic pole to generate potential difference between the contamination or particle collector or the stage and the objective lens so as to form the potential difference, which changes periodically, between the contamination or particle collector and the objective lens or between the stage and the objective lens while the contamination or particle collector is positioned below the beam passage opening of the objective lens.

* * * * *